(12) United States Patent
Yamaji

(10) Patent No.: US 10,547,304 B2
(45) Date of Patent: Jan. 28, 2020

(54) SEMICONDUCTOR INTEGRATED CIRCUIT FOR DRIVING SWITCHING DEVICE WITH INTEGRATED NEGATIVE VOLTAGE CLAMP DIODE

(71) Applicant: Fuji Electric Co., Ltd., Kanagawa (JP)

(72) Inventor: Masaharu Yamaji, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/100,597

(22) Filed: Aug. 10, 2018

(65) Prior Publication Data
US 2019/0074828 A1 Mar. 7, 2019

(30) Foreign Application Priority Data
Sep. 5, 2017 (JP) .................. 2017-170520

(51) Int. Cl.
H03K 17/06 (2006.01)
H02M 1/08 (2006.01)
(Continued)

(52) U.S. Cl.
CPC ....... H03K 17/162 (2013.01); H01L 29/7302 (2013.01); H01L 29/8611 (2013.01);
(Continued)

(58) Field of Classification Search
CPC .. H03K 17/063; H03K 17/162; H03K 17/165; H03K 17/168; H03K 17/0822;
(Continued)

(56) References Cited

U.S. PATENT DOCUMENTS

| 6,225,664 B1* | 5/2001 | Endo ................. H03K 17/063 257/347 |
| 2009/0147422 A1* | 6/2009 | Nakahara ........... H03K 17/0822 361/84 |

(Continued)

FOREIGN PATENT DOCUMENTS

| JP | 2009032968 A  * | 2/2009 |
| JP | 4968487 B2 | 7/2012 |

(Continued)

OTHER PUBLICATIONS

"Advanced IGBT/MOSFET driver," TD350E, Datasheet, ST Microelectronics, Jun. 2013 (Year: 2013).*
(Continued)

Primary Examiner — Gary L Laxton
Assistant Examiner — Jye-June Lee
(74) Attorney, Agent, or Firm — Chen Yoshimura LLP

(57) ABSTRACT

A semiconductor integrated circuit for driving a control terminal of a switching device includes: a driver circuit that alternately applies a positive voltage supplied from a positive voltage source and a negative voltage supplied from a negative voltage source to the control terminal in order to switch the switching device ON and OFF; and a negative voltage clamp diode that is integrated into a semiconductor chip on which the driver circuit is formed, an anode thereof being connected to the negative voltage source and a cathode thereof being connected to the control terminal.

8 Claims, 10 Drawing Sheets

(51) Int. Cl.
  *H03K 17/16* (2006.01)
  *H01L 29/73* (2006.01)
  *H02M 3/158* (2006.01)
  *H01L 29/861* (2006.01)

(52) U.S. Cl.
  CPC .............. *H02M 1/08* (2013.01); *H02M 3/158* (2013.01); *H03K 17/06* (2013.01)

(58) Field of Classification Search
  CPC ............. H01L 29/7302; H01L 29/8611; H01L 23/49562; H02M 1/08; H02M 3/158
  See application file for complete search history.

(56) References Cited

U.S. PATENT DOCUMENTS

| | | |
|---|---|---|
| 2010/0301784 A1 | 12/2010 | Tagome et al. |
| 2011/0215840 A1 | 9/2011 | Machida |
| 2013/0106468 A1 | 5/2013 | Aso |
| 2013/0153916 A1* | 6/2013 | Weyers ............... H01L 29/8611 257/73 |
| 2016/0308523 A1* | 10/2016 | Otake .................. H03K 17/165 |
| 2016/0380625 A1* | 12/2016 | Werker ............... H03K 17/168 327/109 |
| 2018/0115311 A1* | 4/2018 | Norling ............... H03K 17/168 |
| 2018/0175853 A1* | 6/2018 | Curbow ............... H03K 17/168 |

FOREIGN PATENT DOCUMENTS

| | | |
|---|---|---|
| JP | 2013-099123 A | 5/2013 |
| JP | 2013-207553 A | 10/2013 |
| JP | 2015-80335 A | 4/2015 |
| JP | 2015-126342 A | 7/2015 |
| JP | 2015-159235 A | 9/2015 |
| WO | 2010/070899 A1 | 6/2010 |

OTHER PUBLICATIONS

"IGBT/MOSFET Gate Drive Module PEM.GD.01.A112.15.00.XX," Datasheet, PE Module, 2016 (Year: 2016).*

* cited by examiner

SEMICONDUCTOR INTEGRATED CIRCUIT FOR DRIVING SWITCHING DEVICE WITH INTEGRATED NEGATIVE VOLTAGE CLAMP DIODE

BACKGROUND OF THE INVENTION

Technical Field

The present invention relates to a semiconductor integrated circuit for driving the gate of a switching device.

Background Art

In conventional gate driver circuits for driving the gates of switching devices, positive and negative voltages are applied to the gate of the switching device to turn the switching device ON and OFF. When working with high-speed power MOSFETs (hereinafter, simply "MOSFETs"), a gate resistor for reducing parasitic oscillation during switching is connected between the output of the gate driver circuit and the gate of the MOSFET. Here, the gate of the MOSFET is prevented from being erroneously switched ON by taking advantage of the displacement current arising from dV/dt noise and parasitic capacitance between the gate and drain and between the gate and source of the MOSFET as well as the voltage increase arising between the gate and source of the MOSFET due to the gate resistor. Moreover, applying a negative voltage to the gate of the MOSFET reduces the occurrence of malfunctions caused by increases in gate voltage. In this case, a negative voltage source is required to apply such a negative voltage to the gate.

In Patent Document 1, a turn-on gate resistor, a turn-off gate resistor, and a diode are connected in parallel between the output of a gate driver circuit and the gate of a MOSFET in order to inhibit increases in gate voltage during switching and to thereby prevent malfunctions during switching. Moreover, a capacitor is connected between the gate and source of the MOSFET in order to reduce displacement current arising from parasitic capacitance between the gate and drain and to thereby similarly inhibit increases in gate voltage and prevent malfunctions during switching. Furthermore, a negative voltage is applied to the gate of the MOSFET to reduce the occurrence of malfunctions during switching.

However, in Patent Document 1, this addition of passive components near the gate of the MOSFET increases the total number of components, increases the area of the printed circuit board (PCB), and hinders the ability to miniaturize power conversion systems (which is one of the advantages of using switching devices in the first place). Moreover, although applying a negative voltage while in the OFF state is effective in terms of preventing the device from erroneously switching ON, this approach tends to cause negative voltage noise exceeding the rated value (for example, gate-source voltage Vgs≥−5 V) to be applied to the gate.

Furthermore, when using this approach in silicon carbide MOSFETs (hereinafter, "SiC MOSFETs"), reliability problems such as the following can arise. In particular, when the device is operated in an inverter, if the gate is pulled down to too negative of a voltage while in the OFF state or the gate-source voltage exhibits undershoot at gate turn-off due to the effects of excessive parasitic inductance or parasitic capacitance, holes can get trapped in the gate oxide film interface. Then, as switching continues and electrons, holes repeatedly recombine in the interface, causing the deterioration of the gate oxide film. As a result, the threshold voltage of the SiC MOSFET shifts, and the performance of the device as a switch deteriorates. In comparison to silicon (Si) MOSFETs, SiC MOSFETs tend to develop more gate oxide film defects (interface levels), and it is particularly more difficult to completely eliminate threshold voltage shift caused by trapping of holes due to negative voltages. Therefore, in SiC MOSFETs, it is necessary to ensure that negative voltages exceeding the rated value are not applied to the gate. Moreover, it is difficult to completely eliminate undershoot in the gate voltage during switching simply by adjusting gate resistance or by minimizing parasitic inductance or the like.

In Patent Document 2, a bidirectional diode is connected between the source terminal and gate terminal of a switching device to clamp the gate to a negative voltage. The bidirectional diode in Patent Document 2 is a discrete external component, which increases the number of components and thus increases system cost and PCB area.

Patent Document 3 discloses a configuration including a diode in which the cathode is connected to the source terminal of a switching device such as an SiC MOSFET and the anode is connected to the gate terminal, such that the negative voltage is clamped by the forward voltage drop of the diode. In Patent Document 3, this diode is integrated within the switching device, which increases chip size and thus results in a significant cost increase due to the high costs of SiC substrates.

Patent Document 4 discloses a configuration including a diode in which the cathode is connected to the source terminal of a switching device such as an SiC MISFET and the anode is connected to the gate terminal, such that the negative voltage is clamped by the forward voltage drop of the diode. The diode in Patent Document 4 is a discrete external component, which increases the number of components and thus increases system cost and PCB area.

Patent Documents 5 to 8 disclose configurations in which, in order to prevent malfunctions during switching in a wide-bandgap semiconductor device, passive components are used to protect the gate voltage or to add parasitic capacitance. In Patent Documents 5 to 8, these passive components are discrete external components, which increases the total number of components.

RELATED ART DOCUMENTS

Patent Documents

Patent Document 1: Japanese Patent Application Laid-Open Publication No. 2015-80335
Patent Document 2: Japanese Patent Application Laid-Open Publication No. 2013-207553
Patent Document 3: Japanese Patent Application Laid-Open Publication No. 2015-159235
Patent Document 4: Japanese Patent Application Laid-Open Publication No. 2015-126342
Patent Document 5: Japanese Patent No. 4968487
Patent Document 6: Japanese Patent Application Laid-Open Publication No. 2013-099123
Patent Document 7: Japanese Patent Application Laid-Open Publication No. 2015-80335
Patent Document 8: WO 2010/070899

SUMMARY OF THE INVENTION

Accordingly, the present invention is directed to a scheme that substantially obviates one or more of the problems due to limitations and disadvantages of the related art.

In view of the problems described above, the present invention aims to provide a semiconductor integrated circuit which makes it possible to, without increasing the number of components, clamp a negative voltage during switching of a switching device and thereby inhibit deterioration in the performance of the switching device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor integrated circuit for driving a control terminal of a switching device, including: a high-level voltage receiving terminal to be connected to a high-level voltage source so as to receive a high-level voltage; a low-level voltage receiving terminal to be connected to a low-level voltage source or a low-voltage electrode terminal of the switching device so as to receive a low-level voltage that is supplied by the low-level voltage source or that is at the low-voltage electrode terminal; a first output terminal to be connected to the control terminal of the switching device though a gate resistor; a second output terminal to be directly connected to the control terminal of the switching device, thereby bypassing the gate resistor; a driver circuit receiving the high-level voltage through the high-level voltage receiving terminal and receiving the low-level voltage through the low-level voltage receiving terminal, the driver circuit alternately outputting the high-level voltage and the low-level voltage from the first output terminal to the control terminal of the switching device, when connected, in order to switch the switching device ON and OFF; and a negative voltage clamp diode that is integrated in a semiconductor chip in which at least a portion of the driver circuit is formed, an anode of the negative voltage clamp diode being connected to the low-level voltage receiving terminal and a cathode of the negative voltage clamp diode being connected to the second output terminal.

In another aspect, the present disclosure provides a power conversion circuit, including: the above-mentioned semiconductor integrated circuit; a switching device having a control terminal driven by the semiconductor integrated circuit; a gate resistor connected to the control terminal of the switching device; a high-level voltage source connected to the high-level voltage receiving terminal of the semiconductor integrated circuit; and a low-level voltage source connected to the low-level voltage receiving terminal of the semiconductor integrated circuit, wherein the control terminal of the switching device is connected to the first output terminal of the semiconductor integrated circuit through the gate resistor, and is directly connected to the second output terminal of the semiconductor integrated circuit by bypassing the gate resistor.

In another aspect, the present disclosure provides a power conversion circuit, including: the above-mentioned semiconductor integrated circuit; a switching device having a control terminal driven by the semiconductor integrated circuit, the switching device further having a low-voltage electrode terminal: a gate resistor connected to the control terminal of the switching device; and a high-level voltage source connected to the high-level voltage receiving terminal of the semiconductor integrated circuit; wherein the low-level voltage receiving terminal of the semiconductor integrated circuit is connected to the low-voltage electrode terminal of the switching device, and wherein the control terminal of the switching device is connected to the first output terminal of the semiconductor integrated circuit through the gate resistor, and is directly connected to the second output terminal of the semiconductor integrated circuit by bypassing the gate resistor.

The present invention makes it possible to provide a semiconductor integrated circuit making it possible to, without increasing the number of components, clamp a negative voltage during switching of a switching device and thereby inhibit deterioration in the performance of the switching device.

It is to be understood that both the foregoing general description and the following detailed description are exemplary and explanatory, and are intended to provide further explanation of the invention as claimed.

DETAILED DESCRIPTION OF EMBODIMENTS

Figure 1:
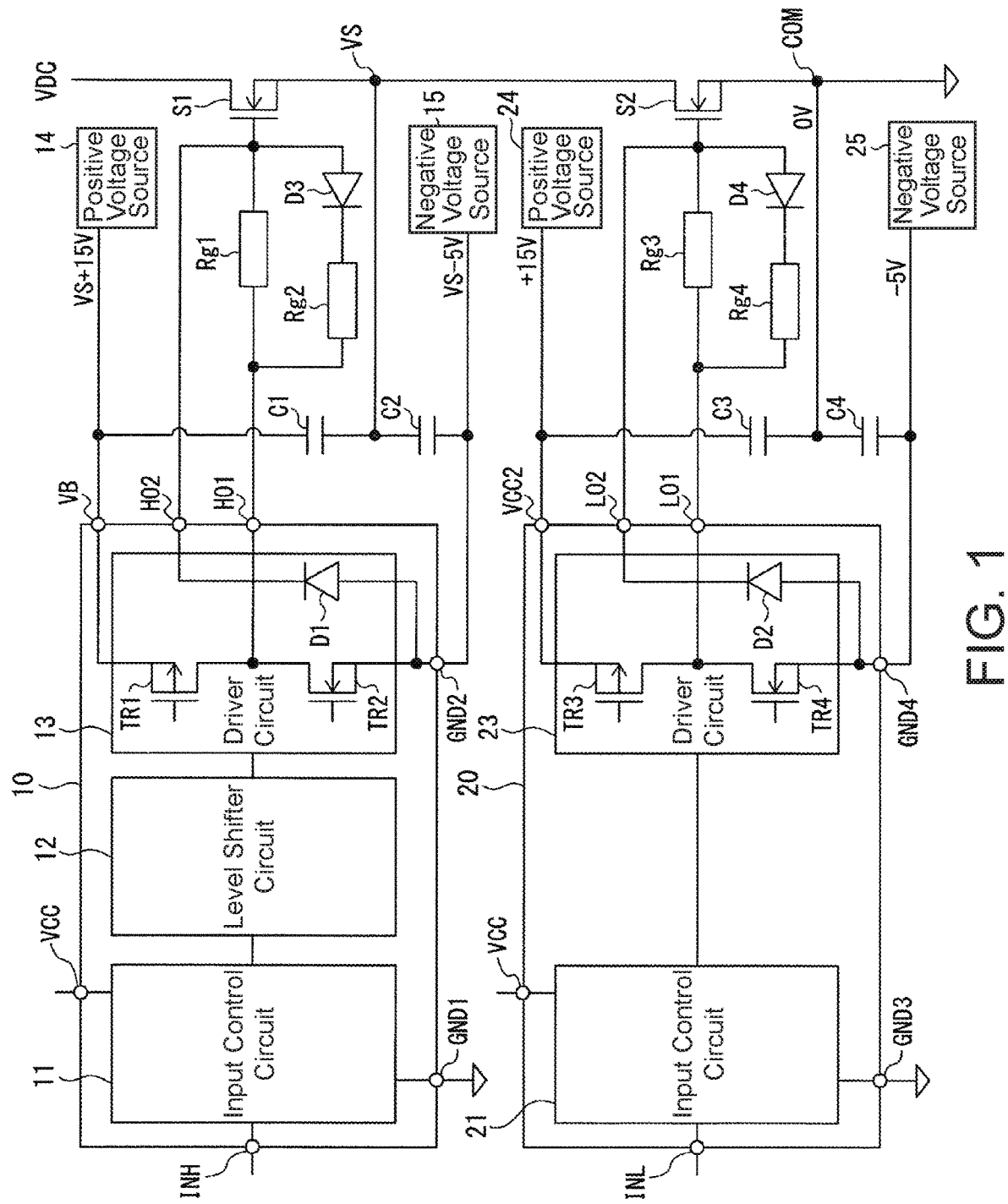
FIG. 1 is a circuit diagram illustrating semiconductor integrated circuits according to Embodiment 1 of the present invention.

Embodiments 1 to 3 of the present invention will be described with reference to figures. In the figures referenced in the descriptions below, the same or similar reference characters are used for components that are the same or similar. However, the figures are only intended to be schematic illustrations, and the relationships between thickness and planar dimensions, the proportions between the thicknesses of each layer, and the like may be different from in the actual devices. Therefore, specific thicknesses and dimensions should be determined by referring to the descriptions below. Similarly, the illustrated dimensional relationships and proportions of components in the figures may differ from one figure to the next.

In Embodiments 1 to 3 of the present invention, although the "first conductivity type" is described as being n-type and the "second conductivity type" is described as being p-type as an example, the conductivity types may be selected in the opposite manner such that the first conductivity type is p-type and the second conductivity type is n-type. Furthermore, in the embodiments of the present invention as well as in the attached drawings, the symbols + and − are appended to the letters n and p as superscripts to indicate that the corresponding semiconductor region has a higher or lower impurity concentration, respectively, than a semiconductor region for which the symbols + and − are not appended. In addition, it should be technically and logically obvious that components or regions described as being of the first conductivity type or the second conductivity type in the following descriptions are components or regions which are made of a semiconductor material, even if not explicitly designated as such.

In Embodiments 1 to 3 of the present invention, the term "first main electrode region" refers to one semiconductor region among the source region and the drain region of an insulated-gate FET (MISFET) or an insulated-gate static induction transistor (MISSIT). In an insulated-gate bipolar transistor (IGBT), the term "first main electrode region" refers to one semiconductor region among the emitter region and the collector region. In an MIS gate static induction thyristor (MIS gate SI thyristor), the term "first main electrode region" refers to one semiconductor region among the anode region and the cathode region. Moreover, in a MISFET or a MISSIT, the term "second main electrode region" refers to the semiconductor region among the source region and the drain region which is not the first main electrode region. In an IGBT, the term "second main electrode region" refers to the semiconductor region among the emitter region and the collector region which is not the first main electrode region. In a MIS gate SI thyristor, the term "second main electrode region" refers to the semiconductor region among the anode region and the cathode region which is not the first main electrode region. In other words, if the "first main electrode region" is the source region, then the "second main electrode region" is the drain region. Similarly, if the "first main electrode region" is the emitter region, then the "second main electrode region" is the collector region. Likewise, if the "first main electrode region" is the anode region, then the "second main electrode region" is the cathode region.

In Embodiments 1 to 3 of the present invention, the term "high-voltage electrode terminal" refers to the drain terminal in a MISFET or MISSIT and refers to the collector terminal in an IGBT. In this case, the term "low-voltage electrode terminal" then refers to the source terminal in a MISFET or MISSIT and refers to the emitter terminal in an IGBT. Moreover, the term "control terminal" refers to the gate terminal in both a MISFET or MISSIT and an IGBT.

In Embodiments 1 to 3 of the present invention, directional terms such as "top" and "bottom" as in "top surface" and "bottom surface" are simply expressions defined in the context of the illustrated cross-sectional views. For example, when viewing a semiconductor device with the orientation changed by 90°, the "up" and "down" directions become the "left" and "right" directions, and when viewing with the orientation changed by 180°, the relationship between the "up" and "down" directions is inverted.

In Embodiments 1 to 3 of the present invention, the terms "semiconductor substrate" and "semiconductor chip" are not limited to referring to base members produced by cutting an ingot grown using the Czochralski process (CZ process) or the float-zone process (FZ process) or the like into wafer shapes. In the present invention, the terms "semiconductor substrate" and "semiconductor chip" comprehensively include a base substrate used as a base member as well as any type of substrate having a layered structure formed using various processes, such as epitaxial substrates in which an epitaxially grown layer is formed on the upper surface of a base substrate or SOI substrates in which an insulating film is layered onto the bottom surface of a base substrate. In other words, the terms "semiconductor substrate" and "semiconductor chip" are general terms referring to a high-level concept which can include base substrates, various layered structures, active regions constituted by portions of such layered structures, and the like.

Embodiment 1

As illustrated in FIG. 1, power semiconductor integrated circuits (hereinafter, simply "semiconductor integrated circuits") 10 and 20 according to Embodiment 1 of the present invention are high breakdown voltage gate driver circuits for driving the gates of a high-side switching device S1 and a low-side switching device S2.

The high-side switching device S1 and the low-side switching device S2 respectively driven by the semiconductor integrated circuits 10 and 20 may be one phase portion of a power conversion bridge circuit, for example. The high-side switching device S1 and the low-side switching device S2 convert power by switching ON and OFF in a complementary manner in accordance with drive signals from the semiconductor integrated circuits 10 and 20. The high-side switching device S1 and the low-side switching device S2 can be constituted by active components such as MOSFETs or IGBTs made of a wide-bandgap semiconductor, for example. In Embodiment 1, the high-side switching device S1 and the low-side switching device S2 will be described as respectively being SiC MOSFETs as an example.

The high-side switching device S1 and the low-side switching device S2 are connected in series between a high-voltage main power supply VDC (a positive electrode side) and a ground voltage (a negative electrode side relative to the main power supply VDC) to form a half-bridge circuit. The high-voltage electrode terminal (drain terminal) of the high-side switching device S1 is connected to the main power supply VDC, and the low-voltage electrode terminal (source terminal) of the low-side switching device S2 is connected to the ground voltage via a common terminal COM. A load such as a motor (not illustrated in the figure) is connected to a reference voltage terminal VS between the low-voltage electrode terminal (source terminal) of the high-side switching device S1 and the high-voltage electrode terminal (drain terminal) of the low-side switching device S2, and a VS voltage at the reference voltage terminal VS is supplied to the load. During the power conversion process, this VS voltage ranges from 0 V to several hundred volts and also sometimes becomes negatively biased.

The semiconductor integrated circuit 10, in accordance with an input signal from a first input terminal INH (a high-side (H) input terminal), outputs from an output terminal HO1 a drive signal for switching the gate of the high-side switching device S1 ON and OFF. The semiconductor integrated circuit 10 includes an input control circuit 11, a level shifter circuit 12 connected to the output side of the input control circuit 11, and a driver circuit 13 connected to the output side of the level shifter circuit 12. The input control circuit 11, the level shifter circuit 12, and the driver circuit 13 are monolithically integrated on a single semiconductor chip (semiconductor substrate), for example.

The input control circuit 11 operates using a ground voltage applied to a ground terminal GND1 as a reference voltage and using a VCC voltage applied to a power supply terminal VCC as a supply voltage. The input control circuit 11, in accordance with the input signal from the first input terminal INH, outputs an ON/OFF signal for switching the high-side switching device S1 ON and OFF. The level shifter circuit 12 level-shifts the ON/OFF signal output from the input control circuit 11 and outputs the resulting signal.

The driver circuit 13 operates using a negative voltage (such as VS−5 V) applied to a power supply terminal GND2 ("low-level voltage receiving terminal") as a reference voltage and using a VB voltage (such as VS+15 V) applied to a power supply terminal VB ("high-level voltage receiving terminal") as a supply voltage. The driver circuit 13, in accordance with the ON/OFF signal output from the level shifter circuit 12, outputs via the output terminal HO1 the drive signal for switching the high-side switching device S1 ON and OFF. In other words, the driver circuit 13 alternately outputs the VB voltage (VS+15 V, for example) and the negative voltage (VS−5 V, for example) as the drive signal. The VB voltage, which is the highest voltage applied to the semiconductor integrated circuit 10, is supplied from a positive voltage source 14, and is maintained to be approximately 15 V higher than the VS voltage. The negative voltage is supplied from a negative voltage source 15 and is maintained to be approximately 5 V lower than the VS voltage.

The driver circuit 13 includes, in the output stage thereof, a complementary MOS (CMOS) circuit in which a first field-effect transistor TR1 (an active component) and a second field-effect transistor TR2 (an active component of the opposite conductivity type relative to the first field-effect transistor) are connected together. A p-channel MOS transistor can be used as the first field-effect transistor TR1, for example, and an n-channel MOS transistor can be used as the second field-effect transistor TR2, for example. The source terminal of the p-channel MOS transistor TR1 is connected to the power supply terminal VB. The source terminal of the n-channel MOS transistor TR2 is connected to the power supply terminal GND2. The output terminal HO1 is connected to between the drain terminal of the p-channel MOS transistor TR1 and the drain terminal of the n-channel MOS transistor TR2.

A negative voltage clamp diode D1 is connected between the power supply terminal GND2 and an output terminal HO2. The anode of the negative voltage clamp diode D1 is connected via the power supply terminal GND2 to the negative voltage source 15. The cathode of the negative voltage clamp diode D1 is connected via the output terminal HO2 to the gate terminal of the high-side switching device S1. The negative voltage clamp diode D1 is integrated onto the semiconductor chip on which the driver circuit 13 is formed.

The negative voltage clamp diode D1 clamps excessive negative ringing noise applied across the gate and source of the high-side switching device S1 during switching and thereby inhibits deterioration in the performance of the high-side switching device S1. The negative voltage clamp diode D1 forward-clamps at less than or equal to the negative voltage (VS−5 V, for example) supplied from the negative voltage source 15, and then creates a negative voltage clamp of low operating resistance due to the parasitic bipolar effect. The negative voltage clamp diode D1 has a reverse breakdown voltage of greater than or equal to the gate drive voltage of the switching device S1.

The power supply terminal VB of the semiconductor integrated circuit 10 is connected to the positive voltage source 14, which supplies a positive voltage (such as VS+15 V). The output terminal HO1 of the semiconductor integrated circuit 10 is connected to the gate terminal of the high-side switching device S1 via a path on which a turn-on gate resistor Rg1 is connected in parallel to a turn-off gate resistor Rg2 and a rectifying diode D3. The output terminal HO2 of the semiconductor integrated circuit 10 is connected to the gate terminal of the high-side switching device S1. The ground terminal GND1 of the semiconductor integrated circuit 10 is grounded. The power supply terminal GND2 of the semiconductor integrated circuit 10 is connected to the negative voltage source 15, which supplies the negative voltage (VS−5 V, for example). A capacitor C1 is connected between the power supply terminal VB and the reference voltage terminal VS. A capacitor C2 is connected between the negative voltage source 15 and the reference voltage terminal VS. The rectifying diode D3, the gate resistors Rg1 and Rg2, and the capacitors C1 and C2 are discrete components which are separate from the semiconductor chip of the semiconductor integrated circuit 10.

On the other hand, the semiconductor integrated circuit 20, in accordance with an input signal from a second input terminal INL (a low-side (L) input terminal), outputs from an output terminal LO1 a drive signal for switching the gate of the low-side switching device S2 ON and OFF. The semiconductor integrated circuit 20 includes an input control circuit 21 and a driver circuit 23 connected to the output side of the input control circuit 21. The input control circuit 21 and the driver circuit 23 are monolithically integrated on a single semiconductor chip (semiconductor substrate), for example.

The input control circuit 21 operates using a ground voltage applied to a ground terminal GND3 as a reference voltage and using a VCC voltage applied to a power supply terminal VCC as a supply voltage. The input control circuit 21, in accordance with the input signal from the second input terminal INL, outputs an ON/OFF signal for switching the low-side switching device S2 ON and OFF.

The driver circuit 23 operates using a negative voltage (such as −5 V) applied to a power supply terminal GND4 ("low-level voltage receiving terminal") as a reference voltage and using a VCC2 voltage (such as 15 V) applied to a power supply terminal VCC2 ("high-level voltage receiving terminal") as a supply voltage. The driver circuit 23, in accordance with the ON/OFF signal output from the input control circuit 21, outputs via the output terminal LO1 the drive signal for switching the low-side switching device S2 ON and OFF. In other words, the driver circuit 23 alternately outputs the VCC2 voltage (15 V, for example) and the negative voltage (−5 V, for example) as the drive signal.

The driver circuit 23 includes, in the output stage thereof, a CMOS circuit in which a first field-effect transistor TR3 (an active component) and a second field-effect transistor TR4 (an active component of the opposite conductivity type relative to the first field-effect transistor TR3) are connected together. A p-channel MOS transistor can be used as the first field-effect transistor TR3, for example, and an n-channel MOS transistor can be used as the second field-effect transistor TR4, for example. The source terminal of the p-channel MOS transistor TR3 is connected to the power supply terminal VCC2. The source terminal of the n-channel MOS transistor TR4 is connected to the power supply terminal GND4. The output terminal LO1 is connected to between the drain terminal of the p-channel MOS transistor TR3 and the drain terminal of the n-channel MOS transistor TR4.

A negative voltage clamp diode D2 is connected between the power supply terminal GND4 and an output terminal LO2. The anode of the negative voltage clamp diode D2 is connected via the power supply terminal GND4 to a negative voltage source 25 which supplies the negative voltage (−5 V, for example). Moreover, the cathode of the negative voltage clamp diode D2 is connected via the output terminal LO2 to the gate terminal of the low-side switching device S2. The negative voltage clamp diode D2 is integrated onto the semiconductor chip on which the driver circuit 23 is formed.

The power supply terminal VCC2 of the semiconductor integrated circuit 20 is connected to a positive voltage source 24 which supplies a positive voltage (such as 15 V). The output terminal LO1 of the semiconductor integrated circuit 20 is connected to the gate terminal of the low-side switching device S2 via a path on which a turn-on gate resistor Rg3 is connected in parallel to a turn-off gate resistor Rg4 and a rectifying diode D4. The output terminal LO2 of the semiconductor integrated circuit 20 is connected to the gate terminal of the low-side switching device S2. The ground terminal GND3 of the semiconductor integrated circuit 20 is grounded. The power supply terminal GND4 of the semiconductor integrated circuit 20 is connected to the negative voltage source 25. A capacitor C3 is connected between the power supply terminal VCC2 and the source terminal of the low-side switching device S2. A capacitor C4 is connected between the source terminal of the low-side switching device S2 and the negative voltage source 25. The rectifying diode D4, the gate resistors Rg3 and Rg4, and the capacitors C3 and C4 are discrete components which are separate from the semiconductor chip on which the semiconductor integrated circuit 20 is formed.

Figure 2:
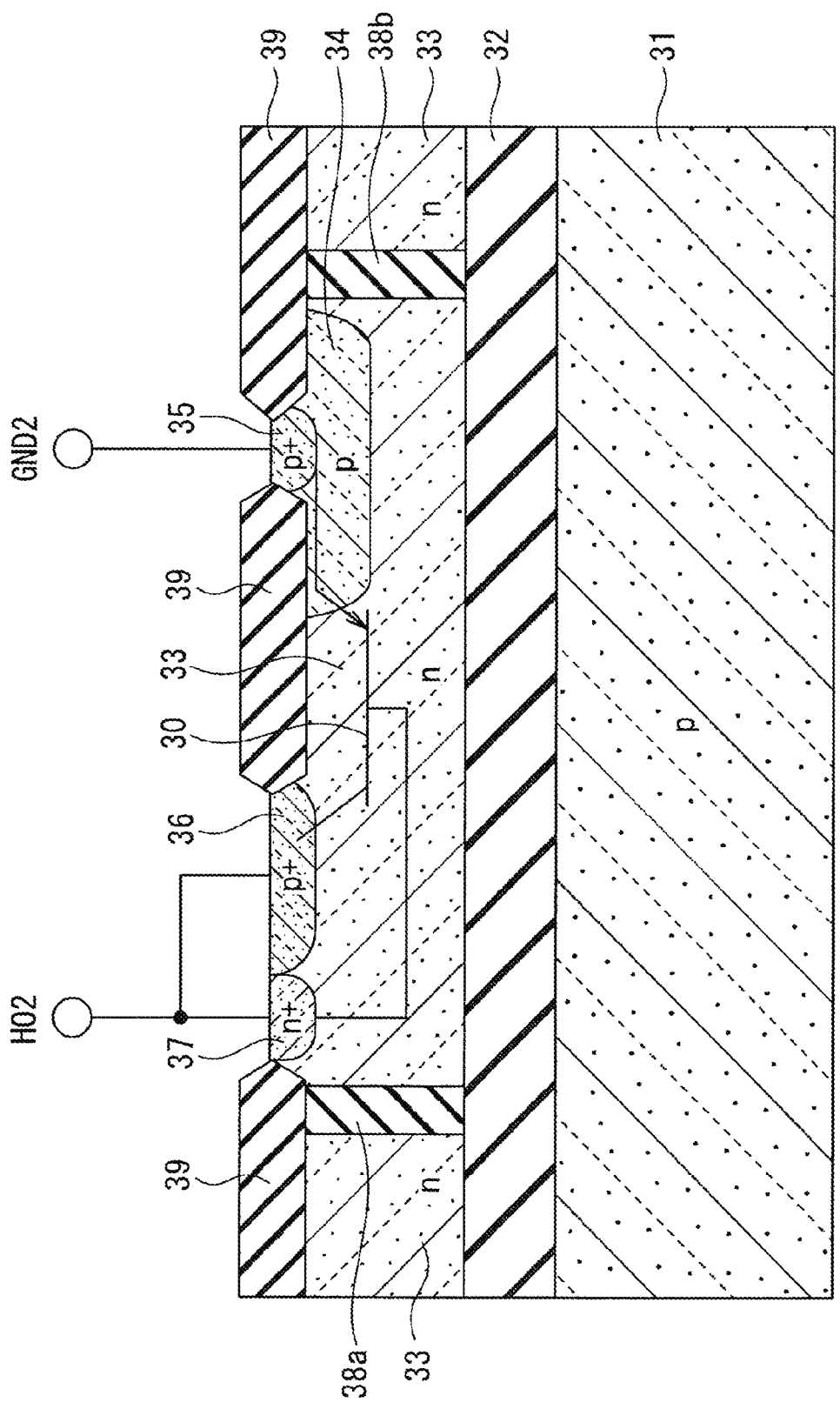
FIG. 2 is a cross-sectional view illustrating an example of a negative voltage clamp diode according to Embodiment 1.

FIG. 2 illustrates an example of the cross-sectional structure of the negative voltage clamp diode D1. Here, an SOI insulating layer (BOX layer) 32 is arranged on the upper surface of a supporting substrate 31 made of p-type monocrystalline Si or the like and an n-type SOI semiconductor layer (well region) 33 is formed on the upper surface of the SOI insulating layer 32 in order to form a dielectrically isolated semiconductor substrate (SOI substrate). In the SOI semiconductor layer 33, trench insulating films 38a and 38b are formed going through the SOI semiconductor layer 33 in the vertical direction and reaching the SOI insulating layer 32, thereby isolating the element. A field insulating film 39 is formed on the upper surface of the SOI semiconductor layer 33.

A p-type offset region 34 is formed in the upper portion of the SOI semiconductor layer 33, and a p$^+$ anode region 35 of a higher impurity concentration than the offset region 34 is formed in the upper portion of the offset region 34. The anode region 35 is connected to the power supply terminal GND2 via a contact hole in the field insulating film 39. An n$^+$ cathode region 37 of a higher impurity concentration than the SOI semiconductor layer 33 is formed separated from the offset region 34 in the upper portion of the SOI semiconductor layer 33. The cathode region 37 is connected to the output terminal HO2 via a contact hole in the field insulating film 39.

The negative voltage clamp diode D1 includes the p$^+$ anode region 35, the p-type offset region 34, the n-type SOI semiconductor layer 33, and the n$^+$ cathode region 37. The impurity concentrations and dimensions of these regions and layers are set such that the avalanche breakdown voltage of the p-n junction between the p-type offset region 34 and the n-type SOI semiconductor layer 33 is greater than or equal to 20 V.

In the upper portion of the SOI semiconductor layer 33 between the offset region 34 and the cathode region 37, a p$^+$ surface short-circuit region 36 is formed contacting the cathode region 37. The surface short-circuit region 36 is connected to the output terminal HO2 via a contact hole in the field insulating film 39, thereby shorting (short-circuiting) this region to the cathode region 37 via surface wiring. This forms a parasitic PNP bipolar transistor 30 in which the p$^+$ anode region 35 serves as the emitter region, the n$^+$ cathode region 37 serves as the base region, and the p$^+$ surface short-circuit region 36 serves as the collector region. When a negative voltage is input to the gate, a forward current flows through the p-n junction between the p-type offset region 34 and the n-type SOI semiconductor layer 33. Then, as holes flow beneath the surface short-circuit region 36, the electric potential of the SOI semiconductor layer 33 builds up, and the parasitic PNP bipolar transistor 30 begins functioning. This makes it possible to achieve a negative voltage clamp diode D1 having an operating resistance that is lower than regular forward clamping characteristics.

Moreover, the p-channel MOS transistor TR1 and the n-channel MOS transistor TR2 illustrated in FIG. 1 are formed in the semiconductor substrate (SOI substrate) in which the negative voltage clamp diode D1 illustrated in FIG. 2 is formed. For example, the p-channel MOS transistor TR1 is formed in the n-type SOI semiconductor layer 33. The n-channel MOS transistor TR2 is formed in a p-type well region formed in the upper portion of the n-type SOI semiconductor layer 33.

The negative voltage clamp diode D1 is used in voltage states which are more negative than those experienced by the reference voltage terminal VS and the common terminal COM. As a result, the voltage of the power supply terminal GND2 to which the negative voltage clamp diode D1 is connected must be isolated from the common ground voltage to which the ground terminal GND1 of the input control circuit 11 of the semiconductor integrated circuit 10 is connected. Therefore, when the input control circuit 11, the level shifter circuit 12, and the driver circuit 13 are formed on a single chip, the negative voltage clamp diode D1 is formed in a dielectrically isolated SOI substrate as illustrated in FIG. 2. On the other hand, when the input control circuit 11, the level shifter circuit 12, and the driver circuit 13 are formed on multiple chips, the negative voltage clamp diode D1 can be formed on the semiconductor chip on which the driver circuit 13 is formed, which is separate from the semiconductor chip on which the input control circuit 11 is formed.

Figure 3:
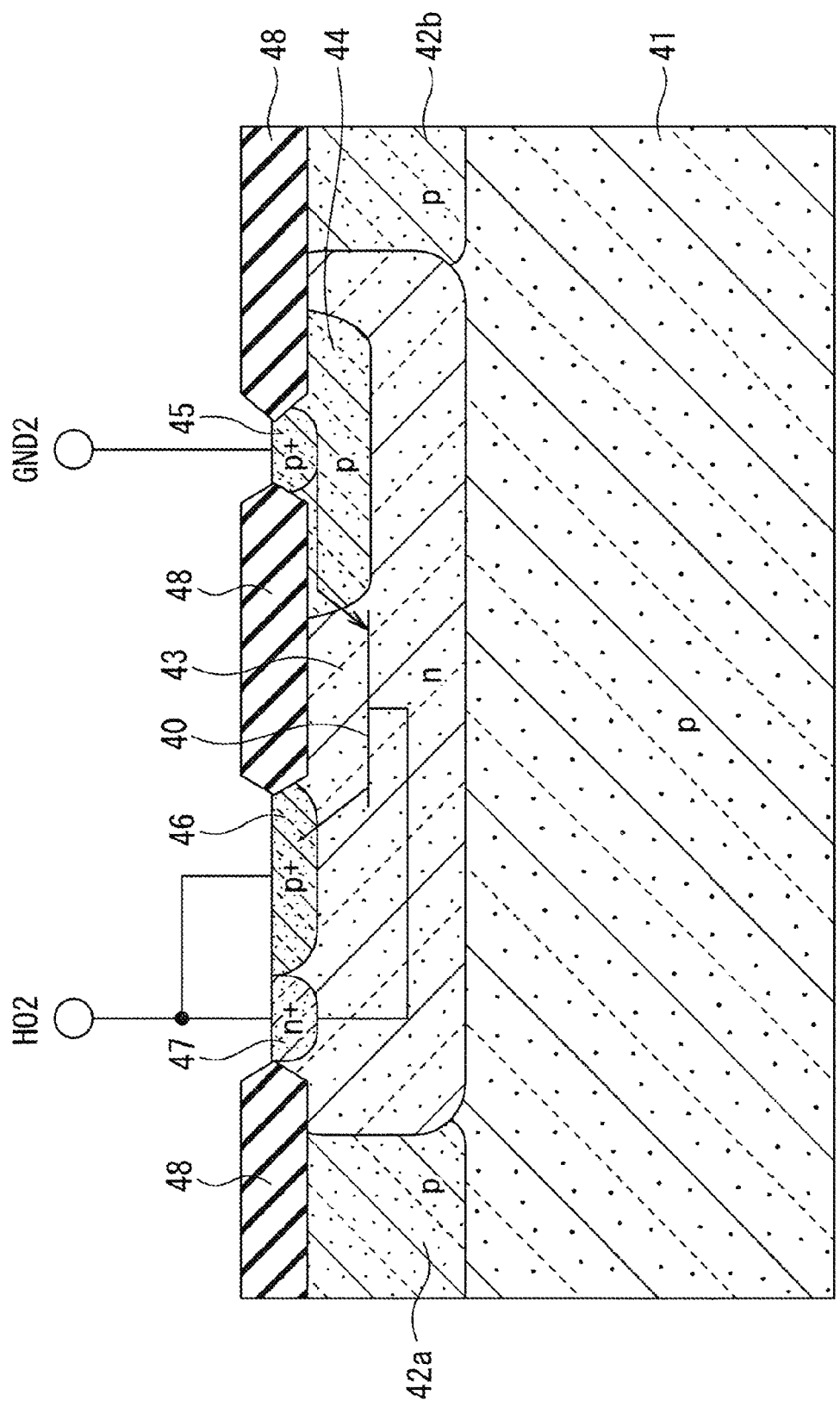
FIG. 3 is a cross-sectional view illustrating another example of a negative voltage clamp diode according to Embodiment 1.

The negative voltage clamp diode D1 may alternatively have a cross-sectional structure such as that illustrated in FIG. 3. FIG. 3 corresponds to a multi-chip configuration in which the input control circuit 11 is formed in a semiconductor chip separate from that in which the negative voltage clamp diode D1 is formed. Here, an n-type well region 43 and p-type well regions 42a and 42b are formed in the upper portion of a p-type semiconductor substrate 41, and a field insulating film 48 is formed on the upper surfaces of the well regions 42a, 42b, and 43. A p-type offset region 44 is formed in the upper portion of the n-type well region 43, and a p$^+$ anode region 45 of a higher impurity concentration than the offset region 44 is formed in the upper portion of the offset region 44. The anode region 45 is connected to the power supply terminal GND2 via a contact hole in the field insulating film 48.

An n+ cathode region 47 of a higher impurity concentration than the well region 43 is formed separated from the offset region 44 in the upper portion of the well region 43. In the upper portion of the well region 43 between the offset region 44 and the cathode region 47, a p+ surface short-circuit region 46 is formed contacting the cathode region 47. The cathode region 47 and the surface short-circuit region 46 are connected to the output terminal HO2 via contact holes in the field insulating film 48, thereby short-circuiting these regions to one another via surface wiring.

Here, the negative voltage clamp diode D1 includes the p+ anode region 45, the p-type offset region 44, the n-type well region 43, and the n+ cathode region 47. Moreover, this forms a parasitic PNP bipolar transistor 30 in which the p+ anode region 45 serves as the emitter region, the n+ cathode region 47 serves as the base region, and the p+ surface short-circuit region 46 serves as the collector region.

Figure 4:
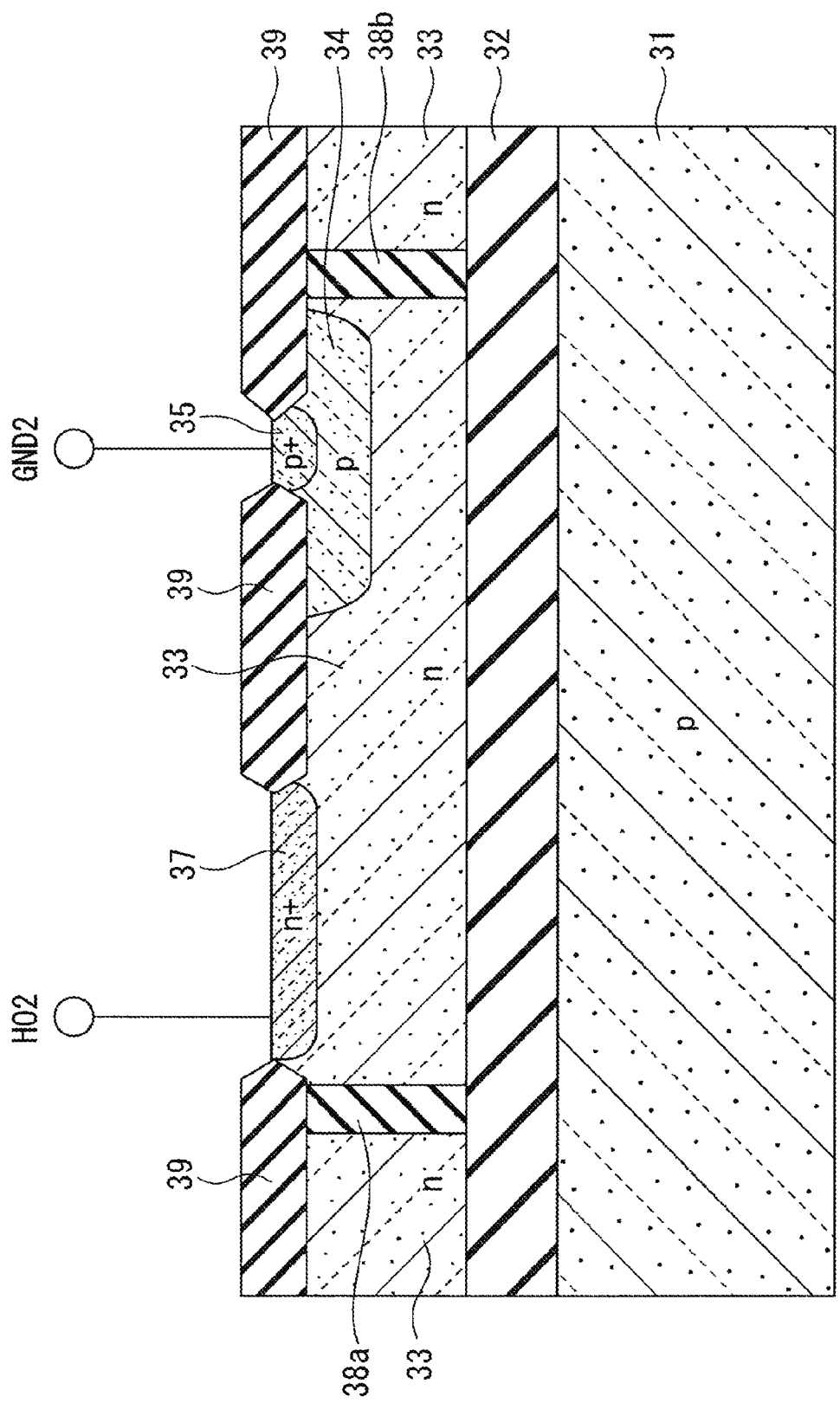
FIG. 4 is a cross-sectional view illustrating yet another example of a negative voltage clamp diode according to Embodiment 1.

The negative voltage clamp diode D1 may alternatively have a cross-sectional structure such as that illustrated in FIG. 4. The cross-sectional structure illustrated in FIG. 4 is different from the cross-sectional structure illustrated in FIG. 2 in that the p+ surface short-circuit region 36 illustrated in FIG. 2 is not present. Here, the negative voltage clamp diode D1 includes the p+ anode region 35, the p-type offset region 34, the n-type SOI semiconductor layer 33, and the n+ cathode region 37, but no parasitic PNP bipolar transistor is formed. Note that although FIGS. 2 to 4 depict examples of structures for the negative voltage clamp diode D1, structures which are the same as the structures illustrated in FIGS. 2 to 4 can also be used for the negative voltage clamp diode D2 illustrated in FIG. 1 as well.

Figure 5:
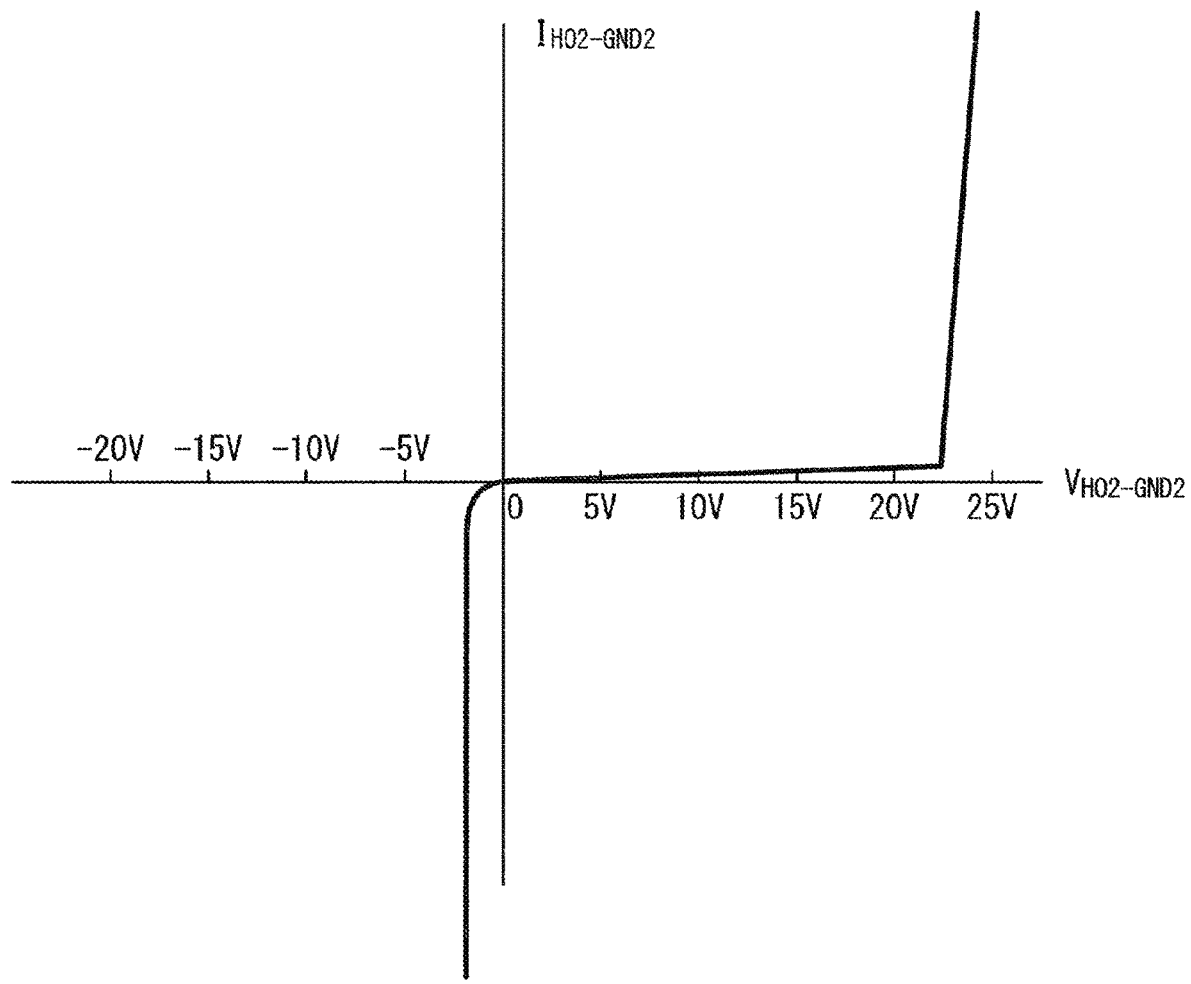
FIG. 5 is a graph showing a gate clamp waveform produced by the negative voltage clamp diode according to Embodiment 1.

FIG. 5 illustrates a negative voltage clamp waveform produced by the negative voltage clamp diode D1 having the structure in which the parasitic PNP bipolar transistor 30 is formed as illustrated in FIG. 2. FIG. 5 shows that the operation of the negative voltage clamp diode D1 and the parasitic PNP bipolar transistor 30 produce a negative voltage clamping effect.

Figure 6:
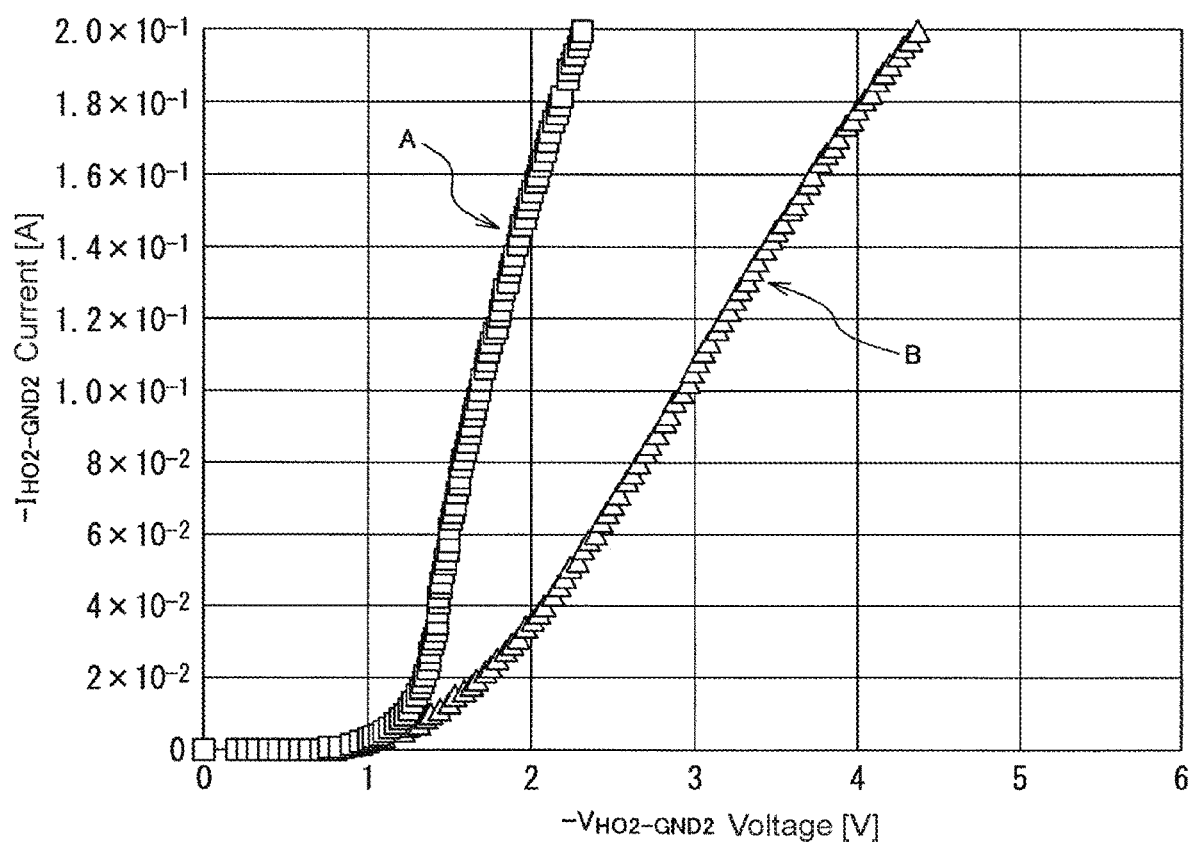
FIG. 6 is a graph showing a gate clamp waveform produced by the negative voltage clamp diode according to Embodiment 1.

FIG. 6 illustrates a negative voltage clamp waveform A produced by the negative voltage clamp diode D1 having the structure in which the parasitic PNP bipolar transistor 30 is formed as illustrated in FIG. 2. FIG. 6 further illustrates a negative voltage clamp waveform B produced by the negative voltage clamp diode D1 having the structure illustrated in FIG. 4, in which no parasitic PNP bipolar transistor is formed. In FIG. 6, the third quadrant of the graph illustrated in FIG. 5 is shown rotated by 180°. As illustrated in FIG. 6, the structure illustrated in FIG. 2 in which the parasitic PNP bipolar transistor 30 is formed has a lower operating resistance than the structure illustrated in FIG. 4 in which no parasitic PNP bipolar transistor is formed, which makes it possible to keep the clamp voltage at a low level.

Figure 7:
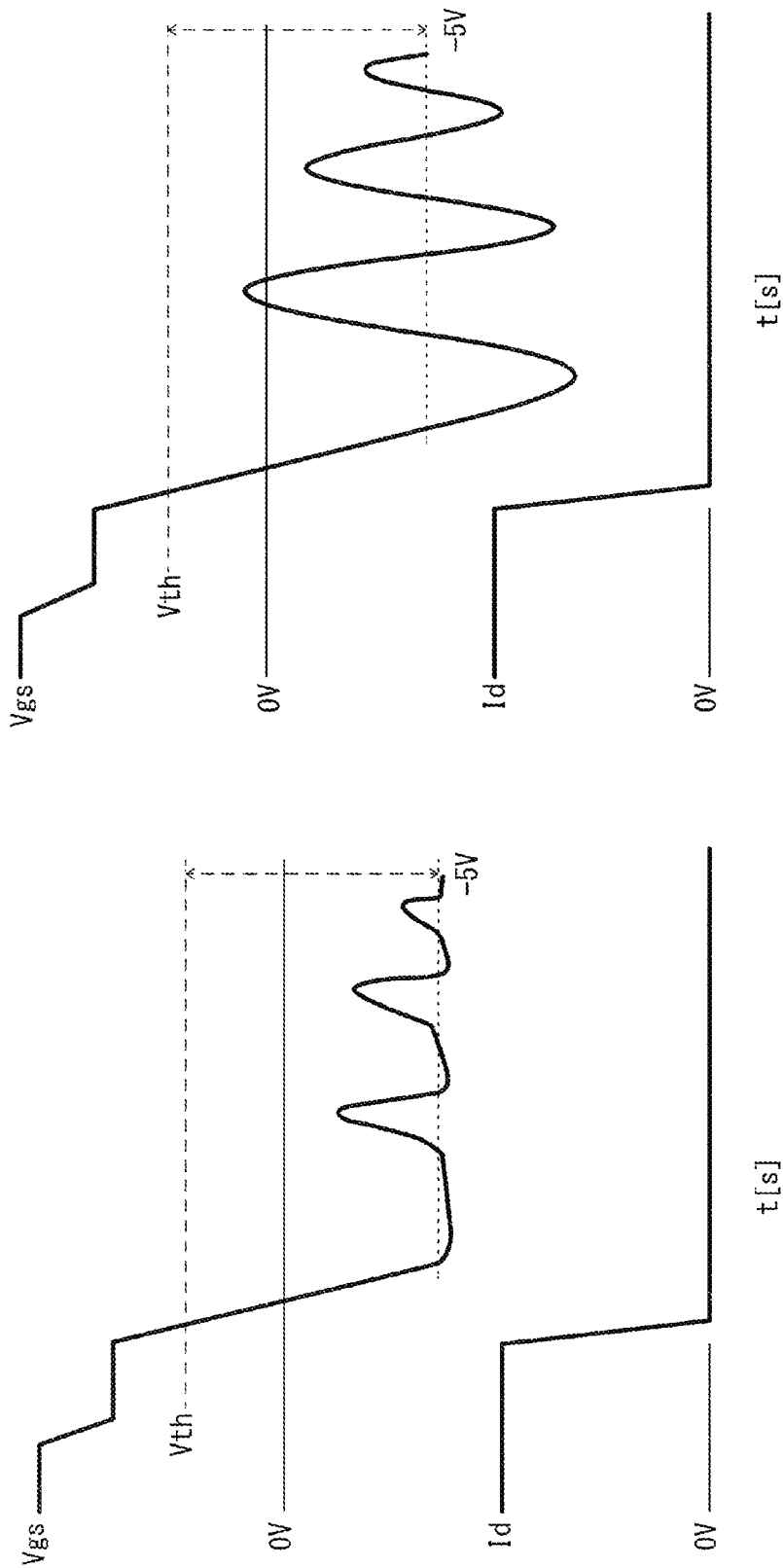
FIG. 7A is a graph showing a gate-source voltage waveform at turn-off of a switching device according to Embodiment 1.
FIG. 7B is a graph showing a gate-source voltage waveform at turn-off of a switching device according to a comparison example.

FIG. 7A illustrates a gate-source voltage Vgs waveform and a drain current Id waveform at turn-off of the high-side switching device S1 in the semiconductor integrated circuit 10 including the negative voltage clamp diode D1 according to Embodiment 1. FIG. 7B illustrates a gate-source voltage Vgs waveform and a drain current Id waveform in a configuration with no negative voltage clamp diode as a comparison example.

As shown in FIGS. 7A and 7B, the threshold voltage Vth of the high-side switching device S1 is set to a positive voltage near 0 V (such as approximately 2 V to 3 V). When the high-side switching device S1 switches OFF, the gate-source voltage Vgs takes a negative voltage (−5 V), which prevents the high-side switching device S1 from erroneously switching ON. In contrast with the comparison example illustrated in FIG. 7B, in Embodiment 1 of the present invention as illustrated in FIG. 7A, overshoot voltage in the gate-source voltage Vgs is reduced by the parasitic capacitance of the negative voltage clamp diode D1. Furthermore, the negative voltage is clamped by the forward voltage drop of the negative voltage clamp diode D1 and by the operation of the parasitic PNP bipolar transistor, thereby inhibiting ringing noise of less than −5 V in the gate-source voltage Vgs.

As described above, the semiconductor integrated circuits 10 and 20 according to Embodiment 1 include the negative voltage clamp diodes D1 and D2, which respectively clamp the gates of the high-side switching device S1 and the low-side switching device S2 to a negative voltage within the semiconductor integrated circuits 10 and 20. Therefore, the semiconductor integrated circuits 10 and 20 according to Embodiment 1 make it possible to clamp negative voltage noise exceeding the rated values, which would otherwise be applied to the gates, thereby making it possible to inhibit deterioration in the performance of the high-side switching device S1 and the low-side switching device S2. Moreover, parasitic PNP bipolar transistors 30 are formed in the negative voltage clamp diodes D1 and D2, thereby making it possible to achieve low operating resistance while clamping this negative voltage noise. Furthermore, the negative voltage clamp diodes D1 and D2 are respectively monolithically integrated into the semiconductor integrated circuits 10 and 20, thereby making it possible to improve the reliability of the high-side switching device S1 and the low-side switching device S2 without increasing the number of components.

In addition, the negative voltage clamp diodes D1 and D2 are respectively connected to the gate terminals of the high-side switching device S1 and the low-side switching device S2 without inserting gate resistors therebetween, thereby making it possible to achieve low operating resistance while clamping negative voltage noise. Moreover, it is preferable that the semiconductor integrated circuits 10 and 20 be arranged near the high-side switching device S1 and the low-side switching device S2 in order to improve the negative voltage clamping effect. This, as illustrated in FIG. 6, makes it possible to reduce gate noise in the high-side switching device S1 and the low-side switching device S2.

Furthermore, the parasitic capacitance of the negative voltage clamp diodes D1 and D2 themselves is respectively added between the gate terminals of the high-side switching device S1 and low-side switching device S2 and the negative voltage sources 15 and 25, thereby also reducing overshoot voltage noise. This makes it possible to reduce the magnitude of the negative voltage needed to prevent malfunctions, thereby making it possible to inhibit deterioration in the performance of the high-side switching device S1 and the low-side switching device S2 as manifested in the form of threshold voltage shift or the like.

Embodiment 2

Although in Embodiment 1 the negative voltage clamp diode D1 was described as being isolated from the p-channel MOS transistor TR1 and the n-channel MOS transistor TR2 of the driver circuit 13 as an example, the present invention is not limited to this example. In Embodiment 2 of the present invention, negative voltage clamp diodes are formed sharing regions with portions of a p-channel MOS transistor TR1 and an n-channel MOS transistor TR2 of a driver circuit 13.

Figure 8:
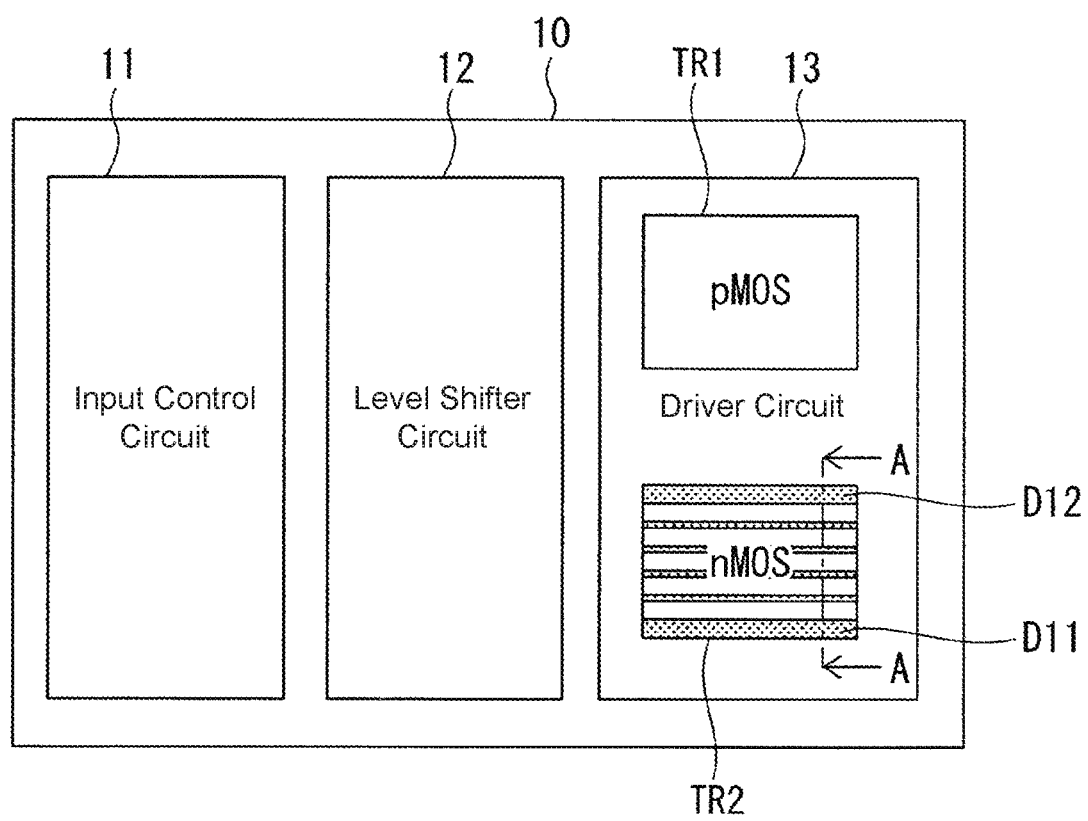
FIG. 8 is a plan view illustrating a negative voltage clamp diode according to Embodiment 2 of the present invention.
Figure 9:
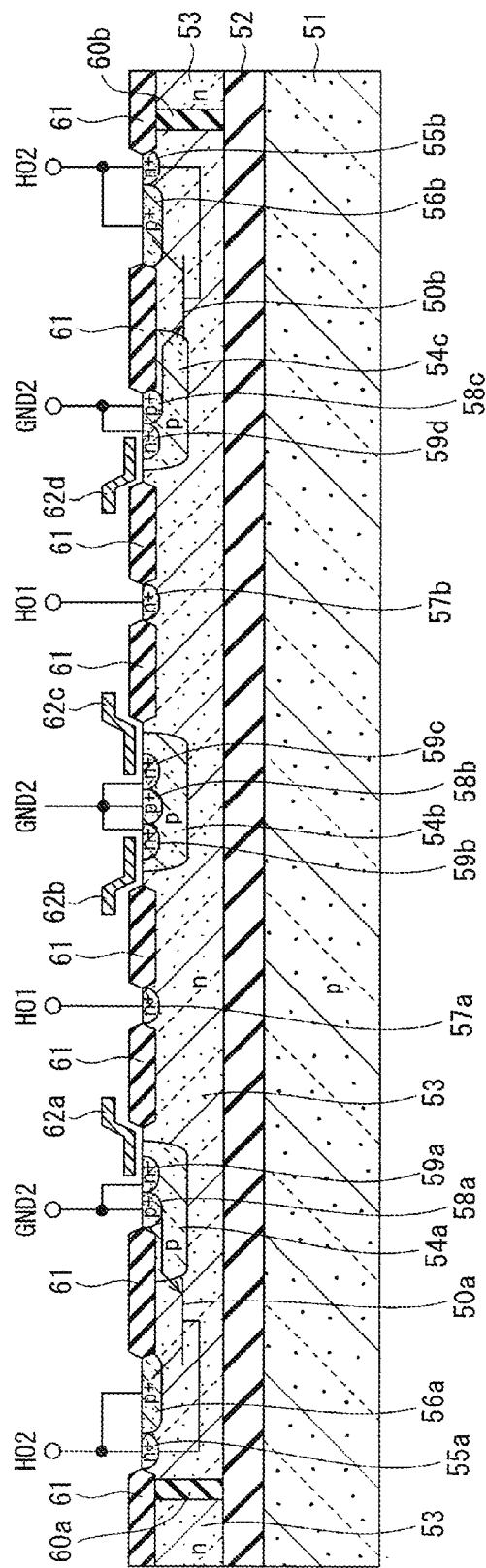
FIG. 9 is a cross-sectional view taken along the A-A direction in FIG. 8.

As illustrated in FIG. 8, a semiconductor integrated circuit 10 according to Embodiment 2 of the present invention includes negative voltage clamp diodes D11 and D12 which are formed sharing regions with portions of the n-channel MOS transistor TR2 of the driver circuit 13. As illustrated in FIG. 9, the n-channel MOS transistor TR2 is formed in an SOI substrate including a supporting substrate 51 made of p-type monocrystalline Si or the like, an SOI insulating layer (BOX layer) 52, and an n-type SOI semiconductor layer (well region) 53. A field insulating film 61 is formed on the upper surface of the SOI semiconductor layer 53. In the SOI semiconductor layer 53, trench insulating films 60a and 60b are formed going through the SOI semiconductor layer 53 in the vertical direction. p-type offset regions 54a, 54b, and 54c are formed in the upper portion of the SOI semiconductor layer 53.

In the upper portion of the offset region 54a positioned on the left side of FIG. 9, a p$^+$ back gate region 58a which has a higher impurity concentration than the offset region 54a and an n$^+$ first main electrode region (source region) 59a which contacts this back gate region 58a are formed. A gate electrode 62a is arranged on the upper surface of the source region 59a and the upper surface of the offset region 54a adjacent to the source region 59a, with a gate insulating film (not illustrated in the figure) interposed therebetween. An n$^+$ second main electrode region (drain region) 57a is formed in the upper portion of the SOI semiconductor layer 53 positioned between the offset regions 54a and 54b.

In the upper portion of the offset region 54b positioned in the center of FIG. 9, a p$^+$ back gate region 58b of a higher impurity concentration than the offset region 54b and n$^+$ first main electrode regions (source regions) 59b and 59c are formed. The source regions 59b and 59c contact the back gate region 58b, with the back gate region 58b interposed therebetween. A gate electrode 62b is arranged on the upper surface of the source region 59b and the upper surface of the offset region 54b adjacent to the source region 59b, with a gate insulating film (not illustrated in the figure) interposed therebetween. A gate electrode 62c is arranged on the upper surface of the source region 59c and on the upper surface of the offset region 54b adjacent to the source region 59c, with a gate insulating film (not illustrated in the figure) interposed therebetween. An n$^+$ second main electrode region (drain region) 57b is formed in the upper portion of the SOI semiconductor layer 53 positioned between the offset regions 54b and 54c.

In the upper portion of the offset region 54c on the right side of FIG. 9, a p$^+$ back gate region 58c which has a higher impurity concentration than the offset region 54c and an n$^+$ first main electrode region (source region) 59d which contacts this back gate region 58c are formed. A gate electrode 62d is arranged on the upper surface of the source region 59d and on the upper surface of the offset region 54c adjacent to the source region 59d, with a gate insulating film (not illustrated in the figure) interposed therebetween.

In the upper portion of the SOI semiconductor layer 53 positioned on the left side of the offset region 54a on the left side of FIG. 9, a p$^+$ surface short-circuit region 56a and an n$^+$ cathode region 55a which contacts the surface short-circuit region 56a and has a higher impurity concentration than the SOI semiconductor layer 53 are formed. The p$^+$ back gate region 58a also serves as an anode region, and together the p$^+$ back gate region 58a, the p-type offset region 54a, the n-type SOI semiconductor layer 53, and the n$^+$ cathode region 55a form the negative voltage clamp diode D11. The anode of the negative voltage clamp diode D11 is connected to a power supply terminal GND2, and the cathode of the negative voltage clamp diode D11 is connected to an output terminal HO2.

Moreover, a parasitic PNP bipolar transistor 50a in which the p$^+$ back gate region 58a serves as the emitter region, the n$^+$ cathode region 55a serves as the base region, and the p$^+$ surface short-circuit region 56a serves as the collector region is formed. The surface short-circuit region 56a is connected to the output terminal HO2, thereby short-circuiting this region to the cathode region 55a via surface wiring.

In the upper portion of the SOI semiconductor layer 53 positioned on the right side of the offset region 54c on the right side of FIG. 9, a p$^+$ surface short-circuit region 56b and an n$^+$ cathode region 55b, which contacts the surface short-circuit region 56b and has a higher impurity concentration than the SOI semiconductor layer 53, are formed. The p$^+$ back gate region 58c also serves as an anode region, and together the p$^+$ back gate region 58c, the p-type offset region 54c, the n-type SOI semiconductor layer 53, and the n$^+$ cathode region 55b form the negative voltage clamp diode D12. The anode of the negative voltage clamp diode D12 is connected to the power supply terminal GND2, and the cathode of the negative voltage clamp diode D12 is connected to the output terminal HO2.

Moreover, a parasitic PNP bipolar transistor 50b in which the p$^+$ back gate region 58c serves as the emitter region, the n$^+$ cathode region 55b serves as the base region, and the p$^+$ surface short-circuit region 56b serves as the collector region is formed. The surface short-circuit region 56b is connected to the output terminal HO2, thereby short-circuiting this region to the cathode region 55b via surface wiring. The rest of the configuration of the semiconductor integrated circuits 10 and 20 according to Embodiment 2 is the same as in the semiconductor integrated circuits 10 and 20 according to Embodiment 1.

In Embodiment 2, the back gate regions 58a, 58b, and 58c of the n-channel MOS transistor TR2 of the driver circuit 13 and the anode regions of the negative voltage clamp diodes D11 and D12 are shared regions which serve both functions, thereby making it possible to further reduce chip size. Moreover, although in Embodiment 2 the two negative voltage clamp diodes D11 and D12 are described as being connected in parallel as an example, just one of the negative voltage clamp diodes D11 and D12 may be formed. Furthermore, although the negative voltage clamp diodes D11 and D12 were described as being formed sharing regions with portions of the n-channel MOS transistor TR2 of the driver circuit 13 as an example, the negative voltage clamp diodes may be formed sharing regions with portions of the p-channel MOS transistor TR1 of the driver circuit 13. In addition, negative voltage clamp diodes may be similarly formed sharing regions with portions of the p-channel MOS transistor TR3 or the n-channel MOS transistor TR4 in the driver circuit 23 on the low-voltage (L) side in FIG. 1 as well.

Embodiment 3

Although Embodiment 1 as illustrated in FIG. 1 was described as using the negative voltage sources 15 and 25, this is only an example. Here, a configuration which does not use any negative voltage sources will be described as Embodiment 3 of the present invention.

Figure 10:
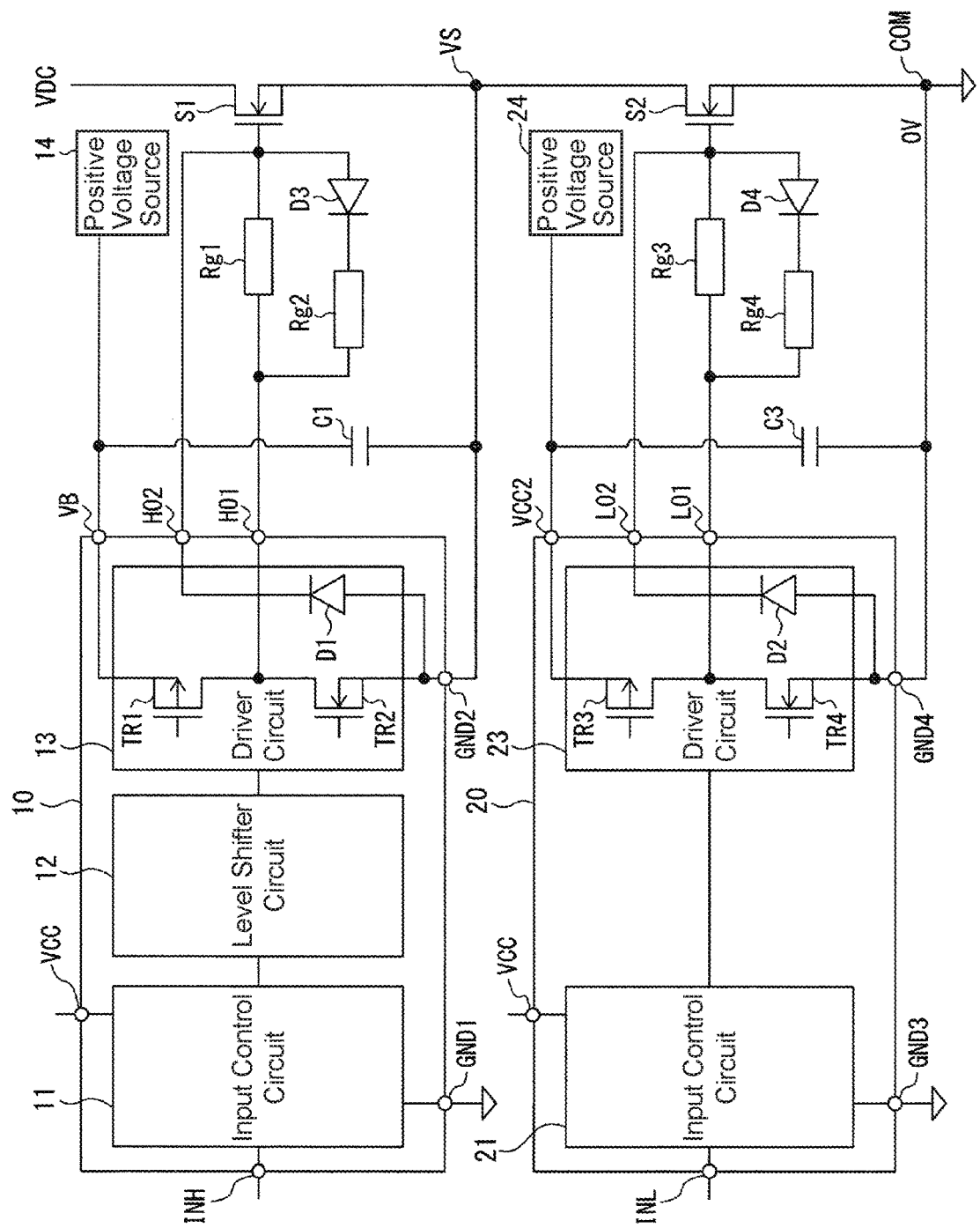
FIG. 10 is a circuit diagram illustrating semiconductor integrated circuits according to Embodiment 3 of the present invention.

As illustrated in FIG. 10, in a semiconductor integrated circuit 10 according to Embodiment 3 of the present invention, a power supply terminal GND2 is connected to a reference voltage terminal VS between a high-side switching device S1 and a low-side switching device S2. A driver circuit 13 alternately applies a positive voltage (VB voltage) supplied from a positive voltage source 14 and a VS voltage of the source terminal of the high-side switching device S1 to the gate terminal of the high-side switching device S1 in order to switch the high-side switching device S1 ON and OFF. The VB voltage is kept approximately 15 V higher than the VS voltage.

The anode of a negative voltage clamp diode D1 is connected to the source terminal of the high-side switching device S1. Moreover, the cathode of the negative voltage clamp diode D1 is connected to the gate terminal of the high-side switching device S1. The negative voltage clamp diode D1 is integrated onto the semiconductor chip on which the driver circuit 13 is formed. The negative voltage clamp diode D1 can have any of the structures illustrated in FIGS. 2 to 4.

Meanwhile, as illustrated in FIG. 10, a power supply terminal GND4 of a semiconductor integrated circuit 20 is connected to the gate terminal of the low-side switching device S2. A driver circuit 23 alternately applies a positive voltage supplied from a positive voltage source 24 and a ground voltage of the source terminal of the low-side switching device S2 to the gate terminal of the low-side switching device S2 in order to switch the low-side switching device S2 ON and OFF.

The anode of a negative voltage clamp diode D2 is connected to the source terminal of the low-side switching device S2. Moreover, the cathode of the negative voltage clamp diode D2 is connected to the gate terminal of the low-side switching device S2. The negative voltage clamp diode D2 is integrated onto the semiconductor chip on which the driver circuit 23 is formed. The negative voltage clamp diode D2 can have any of the structures illustrated in FIGS. 2 to 4. The rest of the configuration of the semiconductor integrated circuits 10 and 20 according to Embodiment 3 is the same as in the semiconductor integrated circuits 10 and 20 according to Embodiment 1.

In Embodiment 3, which has a configuration in which no negative voltage sources are used, the negative voltage clamp diode D1 is connected between the gate terminal and the source terminal of the high-side switching device S1. Moreover, the negative voltage clamp diode D2 is connected between the gate terminal and the source terminal of the low-side switching device S2. Similar to Embodiment 1 of the present invention, this configuration also makes it possible to create negative voltage clamps with the negative voltage clamp diodes D1 and D2, thereby making it possible to inhibit deterioration in the performance of the high-side switching device S1 and the low-side switching device S2. Furthermore, the negative voltage clamp diodes D1 and D2 are monolithically integrated into the semiconductor integrated circuits 10 and 20, thereby making it possible to improve the reliability of the high-side switching device S1 and the low-side switching device S2 without increasing the number of components.

Other Embodiments

Although the present invention was described above with reference to Embodiments 1 to 3, the descriptions and drawings of this disclosure should not be understood to limit the present invention in any way. Various alternative embodiments, examples, and applied technologies based on this disclosure will be obvious to a person skilled in the art.

For example, although in Embodiment 1 the two semiconductor integrated circuits 10 and 20 were described as respectively being formed on single semiconductor chips as illustrated in FIG. 1 as an example, these two semiconductor integrated circuits 10 and 20 may both be collectively formed on a single semiconductor chip. Moreover, two semiconductor chips on which the two semiconductor integrated circuits 10 and 20 are respectively formed may be packaged together in a single package.

Furthermore, although in Embodiment 1 the parasitic PNP bipolar transistor 30 was described as being formed as illustrated in FIGS. 2 and 3 as an example, the polarity of the semiconductor regions illustrated in FIGS. 2 and 3 may be inverted so as to form a parasitic NPN bipolar transistor instead.

In addition, although in Embodiments 1 to 3 the semiconductor integrated circuits 10 and 20 were described as using Si wafers as semiconductor substrates, this is only an example. The technical concepts described in Embodiments 1 to 3 are equally applicable to semiconductor integrated circuits which use a compound semiconductor such as gallium arsenide (GaAs). Moreover, the technical concepts described in Embodiments 1 to 3 can also be applied to semiconductor integrated circuits which use a wide-bandgap semiconductor such as SiC, gallium nitride (GaN), diamond, or the like. Furthermore, these technical concepts can also be applied to semiconductor integrated circuits which use a narrow-gap semiconductor such as indium antimonide (InSb).

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor integrated circuit for driving a control terminal of a switching device, comprising:
   a high-level voltage receiving terminal to be connected to a high-level voltage source so as to receive a high-level voltage;
   a low-level voltage receiving terminal to receive a low-level voltage, wherein the low-level voltage receiving terminal is to be connected to a low-level voltage source so as to receive the low-level voltage that is supplied by the low-level voltage source, or to be connected to a low-voltage electrode terminal of the switching device so as to receive the low-level voltage at the low-voltage electrode terminal;
   a first output terminal to be connected to the control terminal of the switching device through a gate resistor;
   a second output terminal to be directly connected to the control terminal of the switching device, thereby bypassing the gate resistor;
   a driver circuit receiving the high-level voltage through the high-level voltage receiving terminal and receiving the low-level voltage through the low-level voltage receiving terminal, the driver circuit alternately outputting said high-level voltage and said low-level voltage from the first output terminal to the control terminal of the switching device, when connected, in order to switch the switching device ON and OFF; and
   a negative voltage clamp diode that is integrated in a semiconductor chip in which at least a portion of the driver circuit is formed, an anode of the negative voltage clamp diode being connected to the low-level voltage receiving terminal and a cathode of the negative voltage clamp diode being connected to the second output terminal,
wherein the semiconductor chip includes:
a semiconductor layer of a first conductivity type;
an offset region of a second conductivity type formed in a first upper portion of the semiconductor layer of the first conductivity type;
an anode region of the second conductivity type formed in an upper portion of the offset region and having a higher impurity concentration than the offset region; and
a cathode region of the first conductivity type formed in a second upper portion of the semiconductor layer and having a higher impurity concentration than the semiconductor layer,
wherein the anode region, the offset region, the semiconductor layer, and the cathode region together constitute the negative voltage clamp diode,
wherein the semiconductor chip further includes a surface short-circuit region of the second conductivity type that is formed contacting the cathode region in a third upper portion of the semiconductor layer and is short-circuited to the cathode region via surface wiring, and
wherein a parasitic bipolar transistor in which the anode region serves as an emitter region, the cathode region serves as a base region, and the surface short-circuit region serves as a collector region is formed.

2. A power conversion circuit, comprising:
the semiconductor integrated circuit as set forth in claim 1;
the switching device having said control terminal driven by the semiconductor integrated circuit:
the gate resistor connected to the control terminal of the switching device;
the high-level voltage source connected to the high-level voltage receiving terminal of the semiconductor integrated circuit; and
the low-level voltage source connected to the low-level voltage receiving terminal of the semiconductor integrated circuit,
wherein the control terminal of the switching device is connected to the first output terminal of the semiconductor integrated circuit through the gate resistor, and is directly connected to the second output terminal of the semiconductor integrated circuit by bypassing the gate resistor.

3. The power conversion circuit according to claim 2, wherein the driver circuit includes:
a first active component; and
a second active component integrally formed in the semiconductor chip, the second active component being connected in series to the first active component, and
wherein the anode region in the semiconductor chip also serves as a back gate region of the second active component.

4. A power conversion circuit, comprising:
the semiconductor integrated circuit as set forth in claim 1;
the switching device having said control terminal driven by the semiconductor integrated circuit, the switching device further having the low-voltage electrode terminal:
the gate resistor connected to the control terminal of the switching device; and
the high-level voltage source connected to the high-level voltage receiving terminal of the semiconductor integrated circuit;
wherein the low-level voltage receiving terminal of the semiconductor integrated circuit is connected to the low-voltage electrode terminal of the switching device, and
wherein the control terminal of the switching device is connected to the first output terminal of the semiconductor integrated circuit through the gate resistor, and is directly connected to the second output terminal of the semiconductor integrated circuit by bypassing the gate resistor.

5. The power conversion circuit according to claim 4, wherein the driver circuit includes:
a first active component; and
a second active component integrally formed in the semiconductor chip, the second active component being connected in series to the first active component, and
wherein the anode region in the semiconductor chip also serves as a back gate region of the second active component.

6. The semiconductor integrated circuit according to claim 1, wherein the negative voltage clamp diode clamps at less than or equal to the low-level voltage.

7. The semiconductor integrated circuit according to claim 1, wherein the negative voltage clamp diode has a reverse breakdown voltage of greater than or equal to a gate drive voltage of the switching device.

8. The semiconductor integrated circuit according to claim 1,
wherein the driver circuit includes:
a first active component; and
a second active component integrally formed in the semiconductor chip, the second active component being connected in series to the first active component, and
wherein the anode region in the semiconductor chip also serves as a back gate region of the second active component.

* * * * *